(12) United States Patent
Ham et al.

(10) Patent No.: US 8,022,706 B2
(45) Date of Patent: Sep. 20, 2011

(54) SILENT AND THIN RF BODY COIL

(75) Inventors: Kees Ham, Best (NL); Hans Tuithof, Veldhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 269 days.

(21) Appl. No.: 12/304,569

(22) PCT Filed: Jun. 13, 2007

(86) PCT No.: PCT/US2007/071074
§ 371 (c)(1),
(2), (4) Date: Dec. 12, 2008

(87) PCT Pub. No.: WO2007/146978
PCT Pub. Date: Dec. 21, 2007

(65) Prior Publication Data
US 2009/0128150 A1 May 21, 2009

Related U.S. Application Data

(60) Provisional application No. 60/804,856, filed on Jun. 15, 2006.

(51) Int. Cl.
*G01V 3/00* (2006.01)
(52) U.S. Cl. ...................................................... 324/318
(58) Field of Classification Search .......... 324/300–322; 600/410–435
See application file for complete search history.

(56) References Cited

U.S. PATENT DOCUMENTS

| | | | |
|---|---|---|---|
| 4,638,253 A * | 1/1987 | Jaskolski et al. | 324/311 |
| 4,642,569 A * | 2/1987 | Hayes et al. | 324/318 |
| 4,952,878 A | 8/1990 | Mens et al. | |
| 5,572,129 A * | 11/1996 | Carlson | 324/318 |
| 6,043,653 A | 3/2000 | Takamori et al. | |
| 6,084,409 A | 7/2000 | Zebelein et al. | |
| 6,626,264 B1 * | 9/2003 | Christen | 181/290 |
| 6,870,453 B2 * | 3/2005 | Schulz et al. | 335/216 |
| 6,954,068 B1 * | 10/2005 | Takamori et al. | 324/318 |

(Continued)

FOREIGN PATENT DOCUMENTS

DE 102005058651 A1 8/2006

(Continued)

OTHER PUBLICATIONS

Katsunuma, A., et al.; Quiet MRI with novel acoustic noise reduction; 2002; Magnetic Resonance Materials in Physics, Biology and Medicine; 13:139-144.

(Continued)

*Primary Examiner* — Dixomara Vargas

(57) ABSTRACT

An imaging subject (16) is disposed in an examination region (12) for examination. A cover (18) is disposed around the examination region (12). Magnetic field gradient coils (30) impose selected magnetic field gradients on a main magnetic field ($B_0$) within the examination region (12). A radio frequency (RF) coil (36) generates radio frequency excitation pulses in the examination region (12), the radio frequency coil (36) including a plurality of coil elements ($38_1$, $38_2$, $38_3$) disposed on the cover (18) distally from the examination region (12). A radio frequency (RF) screen (40) associated with the coil elements ($38_1$, $38_2$, $38_3$) shields the coil elements ($38_1$, $38_2$, $38_3$) and is disposed about the gradient coils (30) such that the coil elements ($38_1$, $38_2$, $38_3$) are mechanically decoupled from the RF screen (40) and substantially acoustically isolated from the RF screen (40) and gradient coils (30).

17 Claims, 2 Drawing Sheets

U.S. PATENT DOCUMENTS

| | | | |
|---|---|---|---|
| 6,982,553 B2 | 1/2006 | Holle | |
| 7,239,141 B2 | 7/2007 | Nistler et al. | |
| 7,246,681 B2 * | 7/2007 | Christen | 181/285 |

FOREIGN PATENT DOCUMENTS

| | | |
|---|---|---|
| WO | 0054069 A1 | 9/2000 |
| WO | 0122109 A1 | 3/2001 |
| WO | 2004061469 A1 | 7/2004 |

OTHER PUBLICATIONS

Renz, W, et al.; RF breakdown in vacuum layers for MRI noise reduction; 2006; Proc. Intl. Soc. Mag. Reson. Med.; 14:2624.

Weyers, D. J., et al.; A Whole Body RF Coil Design to Reduce Acoustic Noise; 2002; Proc. Intl. Soc. Mag. Reson. Med.; 10:877.

* cited by examiner

SILENT AND THIN RF BODY COIL

CROSS REFERENCE TO RELATED APPLICATIONS

This application claims the benefit of U.S. provisional application Ser. No. 60/804,856 filed Jun. 15, 2006, which is incorporated herein by reference.

The present application relates to the magnetic resonance arts. It finds particular application in conjunction with body coils, and will be described with particular reference thereto. It is to be appreciated, however, that the following may also find application in conjunction with other types of coils in magnetic resonance systems, magnetic resonance spectroscopy systems, and the like.

Magnetic resonance imaging (MRI) apparatus is commonly used for the examination of patients. Magnetic resonance imaging scanners typically include a main magnet, typically superconducting, which generates a spatially and temporally constant magnetic field $B_0$ through an examination region. A radio frequency (RF) coil, such as a linear body coil or a quadrature body coil (QBC), and a transmitter or transmitters are typically tuned to the resonance frequency of the dipoles to be imaged in the magnetic $B_0$ field. The coil and transmitter are used to excite and manipulate the dipoles. Spatial information is encoded by driving the gradient coils with currents to create magnetic field gradients in addition to the magnetic $B_0$ field across the examination region in various directions. Magnetic resonance signals can be acquired by the same or separate receive-only RF coil, demodulated, filtered and sampled by an RF receiver and finally reconstructed into an image on dedicated or general-purpose hardware.

Typically, the RF body coil is rigidly mechanically coupled to and surrounded by a radio frequency (RF) screen such that an integrated solid RF coil/RF screen structure is formed. The RF screen has a slightly smaller diameter than the gradient coil and is hard-coupled to the interior surface of the gradient coil cylinder assembly proximate to the patient bore. The bore covers at the patient side are typically mounted to the RF coil/RF screen structure. During the magnetic resonance imaging, the gradient coil vibrates due to Lorentz forces. The vibrations are transferred to the entire surface of the MRI apparatus and propagate via the RF screen and RF coil to the bore cover. Depending on the surface speed, the mechanical vibrations are transformed into acoustic vibrations, which might cause noise disturbing a patient. Because the RF screen and the RF coil are rigidly mechanically coupled, they maintain their physical relationship to each other even if they vibrate acoustically. Hence, the acoustic vibrations do not change the RF properties of the RF coil.

It is desirable to mechanically decouple the gradient coils from the RF coil/RF screen structure and/or bore covers. One decoupling method is to mount the RF coil/RF screen structure to the gradient coil with an air gap of, for example, 7.5 mm or 1 cm. Another decoupling method is to define an air gap between the RF coil/RF screen structure and the bore covers, for example 5 mm. Unfortunately, both methods lead to either decreasing the diameter of the bore or increasing the diameter of the gradient coil and the magnet. Generally, it is desirable to have a bigger patient aperture, since the smaller aperture presents a problem when the larger patients do not fit comfortably through it, while it is also desirable to keep the inner diameter of the gradient coil small because of the costs concerns, e.g. gradient amplifier costs. Therefore, it is desirable to minimize the space for acoustic and vibration isolation as well as minimize the space for the RF coil/RF screen structure.

The present application provides new and improved methods and apparatuses which overcome the above-referenced problems and others.

In accordance with one aspect, a magnetic resonance imaging apparatus is disclosed. An imaging subject is disposed in an examination region for examination. A cover is disposed around the examination region. Magnetic field gradient coils impose selected magnetic field gradients on a main magnetic field within the examination region. A radio frequency (RF) coil generates radio frequency excitation pulses in the examination region, the radio frequency coil including a plurality of coil elements disposed on the cover distally from the examination region. A radio frequency (RF) screen associated with the coil elements shields the coil elements and is disposed about the gradient coils such that the coil elements are mechanically decoupled from the RF screen and substantially acoustically isolated from the RF screen and gradient coils.

In accordance with another aspect, a magnetic resonance method is disclosed. Individual coil segments are mechanically coupled adjacently one another on a bore cover distally from an examination region and proximately to gradient coils. The coil segments are shielded with a radio frequency (RF) screen. The RF screen is mechanically decoupled from the coil segments and mechanically coupled to the gradient coils. A scanner bore is covered with the bore cover and the coupled coil segments.

In accordance with another aspect, a magnetic resonance apparatus is disclosed. A main magnet generates a main field through an examination region. Magnetic field gradient coils impose selected magnetic field gradients on a main magnetic field within the examination region. A radio frequency (RF) screen associated with an RF coil shields the magnetic field gradient generating coils and is disposed about the gradient coils such that the RF coil is mechanically decoupled from the RF screen and substantially acoustically isolated from the RF screen and the gradient coils. A compensating processor compensates for at least induced changes in RF fields due to at least one of (a) a mechanical interference between the RF screen and the RF coil attributable to the gradient coils vibrations or (b) a patient interaction with the RF coil.

One advantage is that the RF coil is acoustically isolated from the gradient coils without decreasing a bore diameter or increasing a scanner diameter.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
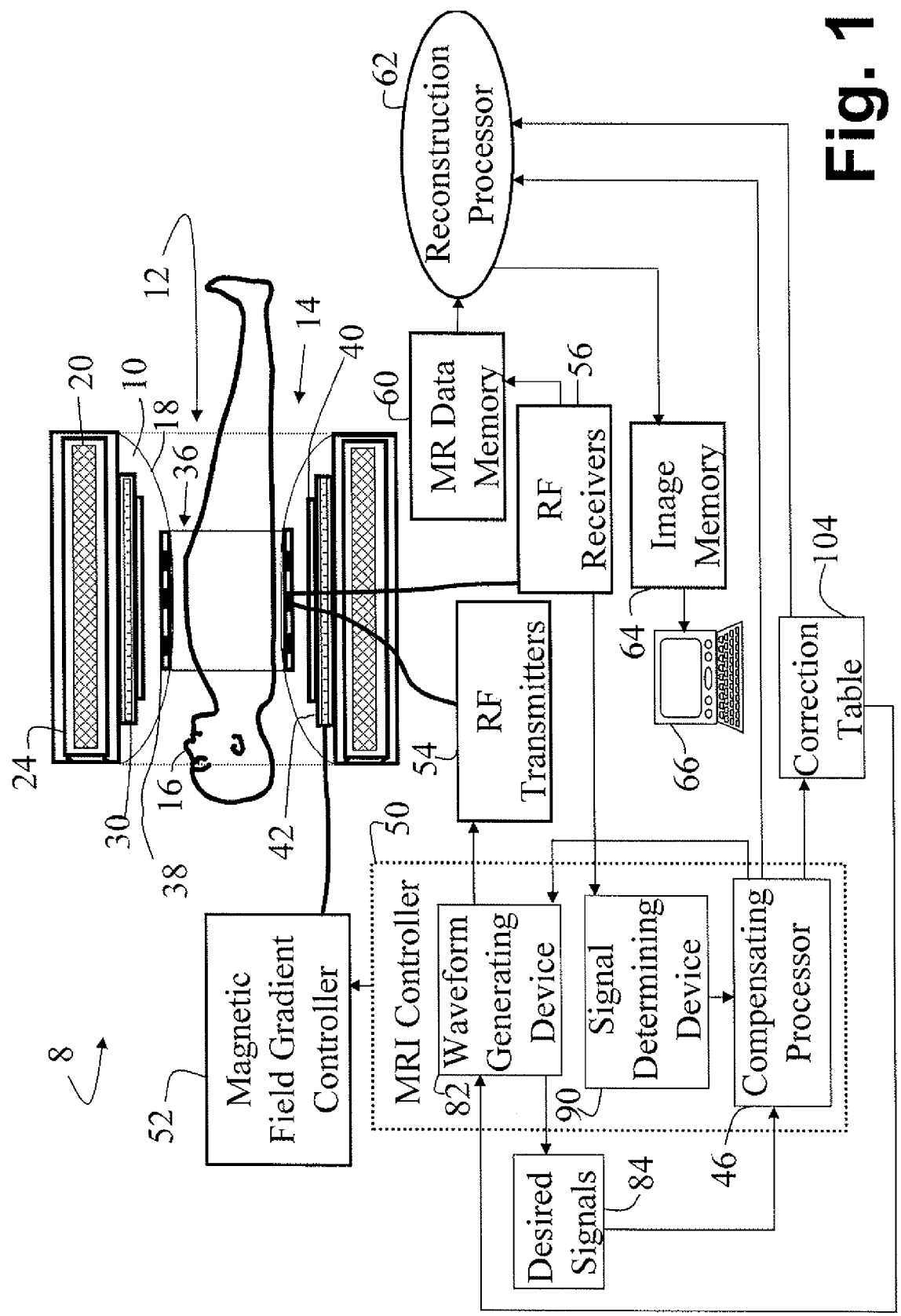
FIG. 1 is a diagrammatic illustration of an imaging system.
Figure 2:
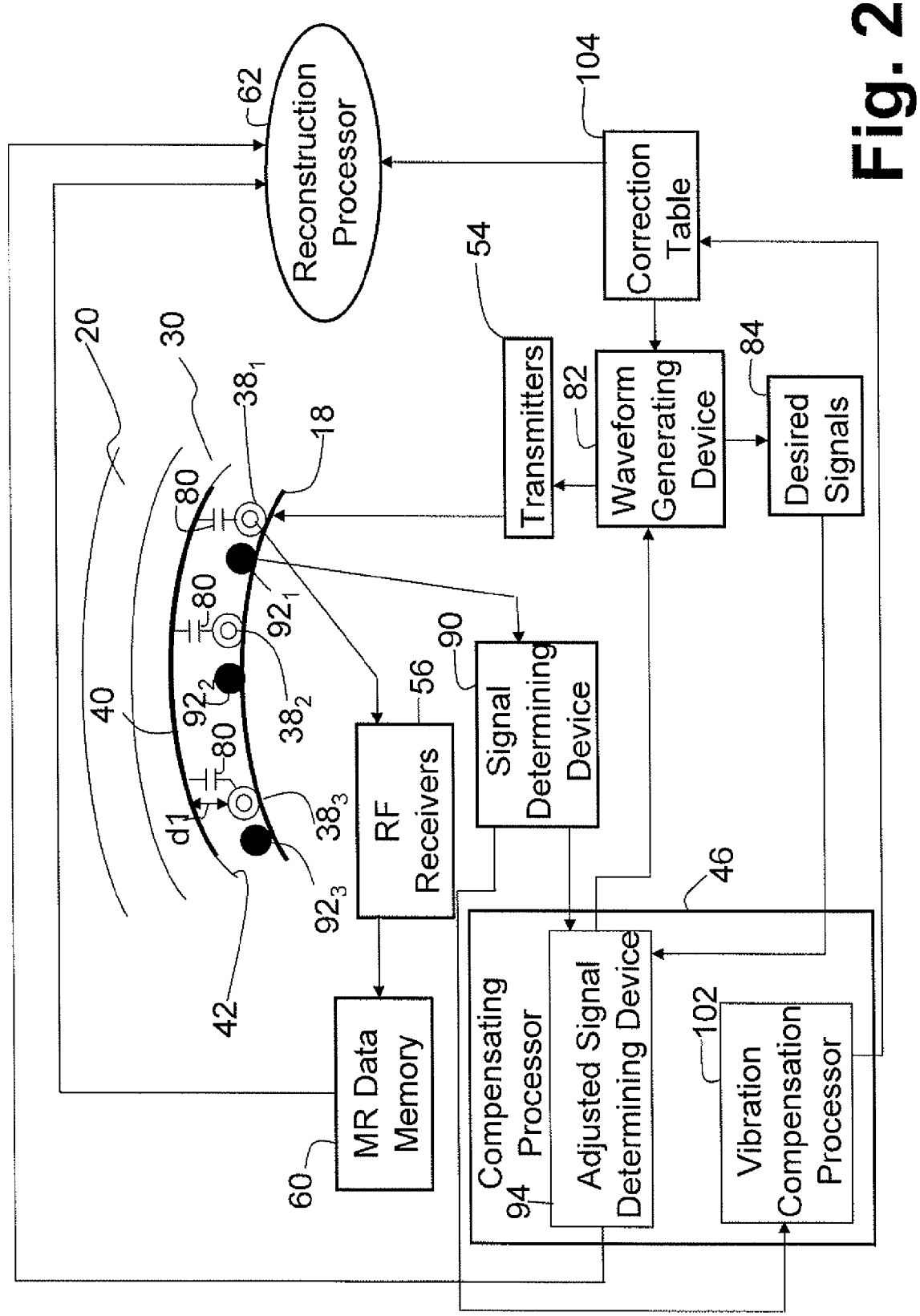
FIG. 2 is a diagrammatic illustration of a detailed portion of an imaging system.

With reference to FIGS. 1 and 2, a magnetic resonance imaging scanner 8 includes a housing 10 defining an examination region 12 in a scanner bore 14. A patient or other imaging subject 16 is disposed in the examination region 12 for diagnostic examination. A cover or covers 18 are disposed around the bore 14 to shield the patient 16 from the scanner hardware disposed in the housing 10 and to improve cosmetic appearance.

A main magnet 20 disposed in the housing 10 generates a main magnetic field $B_0$ in the examination region 12. Typically, the main magnet 20 is a superconducting magnet surrounded by cryo shrouding 24; however, a resistive or permanent main magnet can also be used. Magnetic field gradient coil or coils 30 are arranged in the housing 10 supported by the cryo shrouding or other structures to superimpose selected magnetic field gradients on the main magnetic field within the examination region 12. A radio frequency (RF) coil or coil system or arrangement 36 is disposed about the examination region 12. The coil system 36 includes a plurality of radio frequency coil elements, segments, coils, resonators or rungs 38 which each might have a different size and position. The coil system 36 is, for example, circularly cylindrical, but, of course, might have other geometries, such as an elliptic cross-section, semi-circular cross-section, semi-elliptical cross-section, and the like. The coil system 36 may be a TEM coil, a hybrid TEM-birdcage coil, a birdcage resonator, or other coil including a plurality of axially extending elements or an arrangement of loop resonators, or the like. In the exemplary embodiment, the coil system 36 includes a plurality of rungs 38 disposed axially supported on an inner surface of the bore cover 18, outside of the examination region 12 and proximately to the gradient coils 30. A radio frequency (RF) screen or shield 40, which shields the rungs 38, is mechanically decoupled from the rungs 38 and disposed at or about an interior surface 42 of the gradient coil 30 defining an air gap d1 with the rungs 38. The air gap d1 (e.g. 1-2 cm) mechanically decouples the rungs 38 from the gradient coil 30 and, thus, inhibits the vibrations of the gradient coil 30 to be transmitted to the rungs 38 and, subsequently, the bore cover 18. As discussed in great detail below, a compensating processor, algorithm, device or means 46 measures response of the rungs 38 to each gradient waveform in advance and determines correction parameters which are used to compensate for an interference of the gradient coils 30 and RF screen 40 in a feed forward signal path. The compensating processor 46 also determines whether patients position causes signals in the rungs 38 to differ from the desired signals and compensates for the difference with a feedback loop.

With continuing reference to FIG. 1, a magnetic resonance imaging controller 50 operates magnetic field gradient controllers 52 coupled to the gradient coils 30 to superimpose selected magnetic field gradients on the main magnetic field $B_0$ in the examination region 12, and also operates radio frequency transmitters 54 each coupled to an individual radio frequency coil segment 38 to inject selected radio frequency excitation pulses at about the magnetic resonance frequency into the examination region 12 for imaging. The radio frequency transmitter or transmitters 54 are individually controlled and can have different phases and amplitudes. The radio frequency excitation pulses excite magnetic resonance signals in the imaging subject 16 that are spatially encoded by the selected magnetic field gradients. Still further, the imaging controller 50 controls radio frequency receiver or receivers 56 that each is individually controlled and connected with the corresponding individual coil segment 38 of the coil system 36 to demodulate the generated and spatially encoded magnetic resonance signals. The received spatially encoded magnetic resonance data is stored in a magnetic resonance or MR data memory 60.

A reconstruction processor 62 reconstructs the stored magnetic resonance data into a reconstructed image of the imaging subject 16 or a selected portion thereof lying within the examination region 12. The reconstruction processor 62 employs a Fourier transform SENSE, SMASH, or other suitable reconstruction technique that comports with the spatial encoding used in the data acquisition. The reconstructed image is stored in an image memory 64, and can be displayed on a user interface 66, transmitted over a local area network or the Internet, printed by a printer, or otherwise utilized. In the illustrated embodiment, the user interface 66 also enables a radiologist or other user to interface with the imaging controller 50 to select, modify, or execute imaging sequences. In other embodiments, separate user interfaces are provided for operating the scanner 8 and for displaying or otherwise manipulating the reconstructed images.

The described magnetic resonance imaging scanner 8 is an illustrative example. In general, substantially any magnetic resonance imaging scanner can incorporate the disclosed radio frequency coils. For example, the scanner can be an open magnet scanner, a vertical bore scanner, a low-field scanner, a high-field scanner, or so forth. In the embodiment of FIG. 1, the coil system 36 is used for both transmit and receive phases of the magnetic resonance sequence; however, in other embodiments separate transmit and receive coils may be provided, one or both of which may incorporate one or more of the radio frequency coil designs and design approaches disclosed herein.

With continuing reference to FIG. 1 and reference again to FIG. 2, three resonators or rungs $38_1$, $38_2$, $38_3$ of an exemplary coil are illustrated looking in the axial or z direction. Each resonator $38_1$, $38_2$, $38_3$ is capacitively coupled to the RF screen 40, e.g. via exemplary lumped capacitors 80, while maintaining acoustic isolation. Again, the RF resonators are mounted on the bore cover 18 while the RF screen is mounted on the gradient coil assembly 30. A waveform generating processor, device or means 82 causes each RF transmitter 54 to generate a signal of a predetermined value, which is applied to each resonator $38_1$, $38_2$, $38_3$. Because the bore cover 18 can be flexed by the patient 16, the patient can push individual rungs $38_1$, $38_2$, $38_3$ closer to the RF screen 40 in one location or another. Because the screen and rungs interact, the signals in the rungs $38_1$, $38_2$, $38_3$ can differ from desired or required signals 84 for transmit when the spacing between the RF screen and even portions of the rungs changes. The actual desired signal in each rung is also affected by patient loading, i.e. coupling between the rung and the subject. A signal determining device, processor or means 90 determines an actual amount and/or phase of current which flows in each of the resonators $38_1$, $38_2$, $38_3$ with corresponding pick up coils $92_1$, $92_2$, $92_3$. In one embodiment, a number of pick up coils is equal to a number of rungs, e.g. for a coil including 32 rungs, there are 32 pick up coils each associated with an individual rung. In another embodiment, the number of pick up coils is not equal to the number of rungs, e.g. 32 rungs and 8 pick up coils. An adjusted signal determining device 94 compares a required RF transmit signal input to each rung with the actual signal sensed in each rung to determine the adjusted input signals $U_{adj}$ (amplitude and phase) for each resonator $38_1$, $38_2$, $38_3$ that will result in each resonator actually carrying the desired current. The waveform generating device 82 causes the RF transmitter 54 to generate adjusted signals which are applied to each resonator $38_1$, $38_2$, $38_3$. As a result, the signals in the resonators $38_1$, $38_2$, $38_3$ are substantially equal to the desired signals 84. Of course, it is contemplated that the signals can be corrected when received, e.g. during the reconstruction phase.

In one embodiment, a vibration compensation determining processor, algorithm, device or means 102 determines in advance correction parameters which compensate for response of the RF screen 40 and the rungs $38_1$, $38_2$, $38_3$ to each gradient waveform, and stores the correction parameters in a correction table 104. Each time a given gradient pulse is applied, the same acoustic vibrations occur in the gradient coil assembly and the RF screen causing the same corresponding changes in RF screen and RF coil relationship and the same change in the RF properties of each rung. This change can be calculated or measured empirically during calibration. The waveform generating device 82 applies the correction parameters during generation of the signals as a feed forward compensation. In one embodiment, the correction parameters from the correction table 104 are applied after the signals are received, e.g. during the reconstruction phase.

In this manner, by mechanically (but not electrically) decoupling the rungs 38 from the RF screen 40 and positioning the RF screen 40 at the gradient coil 30, the diameter of the scanner bore 14 is increased by few centimeters, e.g. 1-2 cm. The distance d1 between the rungs 38 and the RF screen 40 is used to isolate vibration of the gradient coil 30. Additionally, one compensation technique is used to compensate for premeasured mechanical interaction of the gradient coil and RF screen. Another compensation technique is used to compensate the signals in case of signal distortions caused by the patient's position, movements or disturbance of the bore cover.

In another embodiment, similar to the embodiments described above, the RF screen 40 is positioned at the gradient coil 30, while the rungs 38 are positioned on the bore cover 18. However, the diameter of the bore 14 remains unchanged, while the inner diameter of the gradient coil 30 is decreased by 1-2 centimeters; therefore, decreasing the overall cost of the system due to reduced costs of the gradient amplifier and superconducting wire. In one embodiment, the inner diameter of the magnet 20 is also correspondingly decreased by 1-2 centimeters.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance imaging apparatus comprising:
   an examination region in which an imaging subject is disposed for examination;
   a cover between the examination region and scanner hardware to protect an imaging subject from scanner hardware;
   magnetic field gradient coils that impose selected magnetic field gradients on a main magnetic field within the examination region;
   a radio frequency (RF) coil, the radio frequency coil including a plurality of coil elements mounted on and supported by the cover adjacent the examination region;
   a radio frequency (RF) screen associated with the coil elements, which radio frequency screen is disposed between the coil elements and the gradient coils, the coil elements being displaced from and mechanically decoupled from the RF screen and substantially acoustically isolated from the RF screen and gradient coils; and one or more processor programmed to electrically compensate for changes in a physical relationship between the screen and the radio frequency elements.

2. A magnetic resonance apparatus including:
   a main magnet, which generates a main field through an examination region;
   magnetic field gradient coils that impose selected magnetic field gradients on the main magnetic field within the examination region;
   an RF coil including a plurality of coil elements;
   a radio frequency (RF) screen associated with the RF coil, which radio frequency screen shields the RF coil, and is disposed between the coil elements and the gradient coils, the RF coil being mechanically decoupled from the RF screen and substantially acoustically isolated from the RF screen and the gradient coils;
   a compensating processor which determines compensating signals to compensate for distortion of signals in each individual coil element due to at least one of (a) an interference of an imaging subject with the coil elements and (b) vibrational interference between the RF screen and gradient coils; and
   a transmitting system, which creates RF pulses in accordance with the determined compensating signals and transmits the corrected RF pulses to corresponding coil elements.

3. A magnetic resonance apparatus including:
   an examination region in which an imaging subject is disposed for examination;
   a cover around the examination;
   magnetic field gradient coils that impose selected magnetic field gradients on a main magnetic field within the examination region;
   a radio frequency (RF) coil which generates radio frequency excitation pulses in the examination region, the radio frequency coil including a plurality of coil elements disposed around the cover distally from the examination region; and
   a radio frequency (RF) screen associated with the coil elements, which radio frequency is disposed between the coil elements and the gradient coils, the coil elements being mechanically decoupled from the RF screen and substantially acoustically isolated from the RF screen and gradient coils; and
   a compensating processor which determines compensation for RF signals in the RF coil due to changes in a physical relationship between the RF coil and the RF screen.

4. The apparatus as set forth in claim 3, further including:
   a waveform generating device which controls an RF transmitting system in accordance with the determined compensation to create compensated RF pulses for each of the coil elements to generate RF fields with selected characteristics.

5. The apparatus as set forth in claim 3, further including:
   a plurality of pickup coils which measure RF signals induced in the coil elements, the compensating processor determining the compensation in accordance with an error between the measured RF signals and required RF signals.

6. The apparatus as set forth in claim 5, further including a plurality of transmitters connected to the plurality of coil elements and wherein the compensating processor includes:
   an adjusted signal determining device which compares the measured signals and the required signals and determines an adjusted signal for each of the transmitters.

7. The apparatus as set forth in claim 5, further including a plurality of receivers connected to the plurality of coil elements and the compensating processor includes:
   an adjusted signal determining device which compares the measured signals and the required signals and determines an adjusted signal for each of the receivers.

8. The apparatus as set forth in claim 3, further including:
   gradient coil controllers coupled to the gradient coils which superimpose selected magnetic field gradient waveforms on the main magnetic field.

9. The apparatus as set forth in claim 8, further including:
   a correction table from which correction parameters are withdrawn to compensate for mechanical interference between the RF screen and the RF coil during activation of the gradient coil.

10. The apparatus as set forth in claim 9, further including:
a waveform generating device which controls a transmitting system to create RF pulses in accordance with the correction parameters and transmit the corrected RF pulses to each of the coil elements.

11. A magnetic resonance method including:
mounting individual RF coil segments adjacently one another encircling an examination region and proximate to and spaced from gradient coils;
mounting a radio frequency (RF) screen between the coil segments and the coil elements, the RF screen being mechanically decoupled from the coil segments and mechanically coupled to the gradient coils; and
determining compensation corrections for RF signals of each individual coil segment to compensate for changes in RF coupling between the RF coil segments and the RF screen caused by changes in a mechanical relationship between the RF screen and at least one of the RF coil segments.

12. The method as set forth in claim 11, further including:
generating a substantially spatially and temporally constant magnetic field in the examination region which is defined by the bore cover;
imposing selected magnetic field gradients on the main magnetic field within the examination region with the gradient coils; and
conducting a magnetic resonance sequence including applying RF pulses to and receiving resonance signals with the coil segments.

13. The method as set forth in claim 11, further including:
creating RF pulses which are compensated with the compensation corrections;
applying the created RF pulses to the coil segments;
sensing RF pulses transmitted by the RF coil segments; and
altering the compensation corrections in accordance with a difference between the sensed RF pulses and required RF pulses with a feedback compensation loop.

14. The method as set forth in claim 11, further including:
creating RF pulses;
applying the created RF pulses to the coil segments;
sensing RF pulses transmitted by the RF coil segments;
determining a difference between the sensed RF pulses and required RF pulses;
receiving magnetic resonance signals; and
altering the received magnetic resonance signals in accordance with the determined difference.

15. The method as set forth in claim 11, wherein actuation of the gradient coils changes the mechanical relationship between the RF screen and at least one of the coil segments, and further including:
compensation correcting the RF signals in each individual coil segment during actuation of the gradient coils.

16. The method as set forth in claim 11, wherein the step of determining compensation corrections includes:
superimposing selected magnetic field gradient waveforms on a main magnetic field with the gradient coils;
measuring a change in each coil segment during application of the gradient;
determining correction parameters which compensate for the measured change; and
storing the correction parameters in a correction table.

17. The method as set forth in claim 16, further including one of:
creating RF pulses in accordance with the correction parameters, and
applying the corrected RF pulses to each of the coil segments; and
receiving magnetic resonance signals, and
applying the correction parameters to the received magnetic resonance signals.

* * * * *